(12) United States Patent
Kuo

(10) Patent No.: US 11,895,826 B2
(45) Date of Patent: Feb. 6, 2024

(54) METHOD FOR PREPARING SEMICONDUCTOR DEVICE STRUCTURE WITH AIR GAP

(71) Applicant: NANYA TECHNOLOGY CORPORATION, New Taipei (TW)

(72) Inventor: Chin-Te Kuo, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 339 days.

(21) Appl. No.: 17/503,662

(22) Filed: Oct. 18, 2021

(65) Prior Publication Data

US 2022/0037331 A1 Feb. 3, 2022

Related U.S. Application Data

(62) Division of application No. 16/654,497, filed on Oct. 16, 2019, now Pat. No. 11,217,591.

(51) Int. Cl.
| | |
|---|---|
| H01L 29/76 | (2006.01) |
| H01L 29/94 | (2006.01) |
| H01L 27/108 | (2006.01) |
| H10B 12/00 | (2023.01) |
| H01L 21/762 | (2006.01) |
| H01L 21/764 | (2006.01) |

(52) U.S. Cl.
CPC ........... *H10B 12/37* (2023.02); *H01L 21/764* (2013.01); *H01L 21/76224* (2013.01); *H10B 12/056* (2023.02); *H10B 12/36* (2023.02); *H10B 12/485* (2023.02); *H10B 12/488* (2023.02)

(58) Field of Classification Search
CPC ...... H10B 12/37; H10B 12/056; H10B 12/36; H10B 12/485; H10B 12/488; H01L 21/76224; H01L 21/764; H01L 21/823431; H01L 27/0886
USPC ....................................................... 257/301
See application file for complete search history.

(56) References Cited

U.S. PATENT DOCUMENTS 9,679,965 B1* 6/2017 Suk .................. H01L 29/42392
2017/0012042 A1* 1/2017 Cai .................. H01L 29/41791

* cited by examiner

*Primary Examiner* — Theresa T Doan
(74) *Attorney, Agent, or Firm* — Xuan Zhang

(57) ABSTRACT

A method for preparing a semiconductor device structure includes forming a first fin structure and a second fin structure over a semiconductor substrate, forming an isolation structure over the semiconductor substrate, partially removing the first fin structure and the second fin structure to form a recessed portion of the first fin structure and a recessed portion of the second fin structure, epitaxially growing a first source/drain (S/D) structure over the recessed portion of the first fin structure and a second S/D structure over the recessed portion of the second fin structure, partially removing the isolation structure through the first opening to form a second opening, and forming a contact etch stop layer (CESL) over the first S/D structure and the second S/D structure such that an air gap is formed and sealed in the first opening and the second opening.

7 Claims, 10 Drawing Sheets

METHOD FOR PREPARING SEMICONDUCTOR DEVICE STRUCTURE WITH AIR GAP

CROSS-REFERENCE TO RELATED APPLICATION

This application is a divisional application of U.S. Non-Provisional application Ser. No. 16/654,497 filed Oct. 16, 2019, which is incorporated herein by reference in its entirety.

TECHNICAL FIELD

The present disclosure relates to a method for preparing a semiconductor device structure, and more particularly, to a method for preparing a semiconductor device structure with an air gap between adjacent source/drain (S/D) structures.

DISCUSSION OF THE BACKGROUND

Due to their structural simplicity, dynamic random access memories (DRAMs) can provide more memory cells per unit chip area than other types of memories, such as static random access memories (SRAMs). A DRAM is constituted by a plurality of DRAM cells, each of which includes a capacitor for storing information and a transistor coupled to the capacitor for regulating when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL while the WL is asserted.

To satisfy the demand for greater memory storage, the dimensions of the DRAM memory cells have been continuously reduced, causing the packing densities of such DRAMs to increase considerably. However, as DRAM memory cell dimension requirements dictate decreasing sizes, capacitive coupling is becoming an increasingly important issue that results in increased parasitic capacitance. Accordingly, the speeds of DRAM memory cells are undesirably reduced, and the overall device performance is therefore negatively impacted.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first fin structure and a second fin structure disposed over a semiconductor substrate, and a first word line disposed across the first fin structure and the second fin structure. The semiconductor device structure also includes a first source/drain (S/D) structure disposed over the first fin structure and adjacent to the first word line, and a second S/D structure disposed over the second fin structure and adjacent to the first word line. The first S/D structure and the second S/D structure have an air gap therebetween.

In some embodiments, the semiconductor device structure further comprises: a bit line contact disposed over the first S/D structure, wherein the first S/D structure is electrically connected to a bit line through the bit line contact.

In some embodiments, the semiconductor device structure further comprises: a second word line disposed across the first fin structure and the second fin structure, wherein the first S/D structure, the second S/D structure and the air gap are between the first word line and the second word line.

In some embodiments, the semiconductor device structure further comprises: a first deep trench capacitor covered by the first word line; and a second deep trench capacitor covered by the second word line, wherein the second S/D structure is between the first deep trench capacitor and the second deep trench capacitor.

In some embodiments, the air gap extends between the first fin structure and the second fin structure.

In some embodiments, the semiconductor device structure further comprises: a contact etch stop layer (CESL) disposed over a sidewall of the first S/D structure and a sidewall of the second S/D structure, wherein the air gap is surrounded by the CESL and sealed by the CESL.

In some embodiments, a portion of the first S/D structure having a maximum width is located higher than a topmost point of the air gap in a cross-sectional view.

In another embodiment of the present disclosure, a semiconductor device structure is provided. The semiconductor device structure includes a first fin structure and a second fin structure disposed over a semiconductor substrate, and a first word line and a second word line disposed across the first fin structure and the second fin structure. The semiconductor device structure also includes a first source/drain (S/D) structure disposed over a recessed portion of the first fin structure and between the first word line and the second word line, and a second S/D structure disposed over a recessed portion of the second fin structure and between the first word line and the second word line. The recessed portion of the first fin structure and the recessed portion of the second fin structure have a first air gap therebetween.

In some embodiments, the first air gap extends between the first S/D structure and the second S/D structure, and the first air gap is partially covered by the first S/D structure.

In some embodiments, a portion of the first air gap having a maximum width is located lower than a top surface of the recessed portion of the first fin structure in a cross-sectional view.

In some embodiments, the semiconductor device structure further comprises: an isolation structure formed between the first fin structure and the second fin structure, wherein the portion of the first air gap having the maximum width is located lower than an interface between the isolation structure and the first S/D structure.

In some embodiments, the semiconductor device structure further comprises: a third fin structure disposed over the semiconductor substrate, wherein the second fin structure is between the first fin structure and the third fin structure, and the first word line and the second word line extend across the third fin structure; and a third S/D structure disposed over a recessed portion of the third fin structure between the first word line and the second word line, wherein the recessed portion of the second fin structure and the recessed portion of the third fin structure have a second air gap therebetween.

In some embodiments, the semiconductor device structure further comprises: a first bit line contact disposed over the first S/D structure, wherein the first S/D structure is electrically connected to a first bit line through the first bit line contact; and a second bit line contact disposed over the third S/D structure, wherein the third S/D structure is electrically connected to a second bit line through the second bit line contact.

In one embodiment of the present disclosure, a method for preparing a semiconductor device structure is provided. The method includes forming a first fin structure and a second fin structure over a semiconductor substrate, and forming an isolation structure over the semiconductor substrate. The first fin structure and the second fin structure protrude from the isolation structure. The method also includes partially removing the first fin structure and the second fin structure to form a recessed portion of the first fin structure and a recessed portion of the second fin structure, and epitaxially growing a first source/drain (S/D) structure over the recessed portion of the first fin structure and a second S/D structure over the recessed portion of the second fin structure. The first S/D structure is separated from the second S/D structure by a first opening. The method further includes partially removing the isolation structure through the first opening to form a second opening, and forming a contact etch stop layer (CESL) over the first S/D structure and the second S/D structure such that an air gap is formed and sealed in the first opening and the second opening.

In some embodiments, a top surface and a sidewall of the recessed portion of the first fin structure protrude from the isolation structure before the first S/D structure is epitaxially grown.

In some embodiments, a width of the first opening increases from a top portion of the first opening to a bottom portion of the first opening, and a width of the second opening decreases from a top portion of the second opening to a bottom portion of the second opening.

In some embodiments, a sidewall of the isolation structure is exposed in the second opening.

In some embodiments, the CESL extends into the first opening and the second opening, and the sidewall of the isolation structure is covered by the CESL.

In some embodiments, the method for preparing a semiconductor device structure further comprises: forming a first word line and a second word line across the first fin structure and the second fin structure, wherein the first S/D structure, the second S/D structure, and the air gap are between the first word line and the second word line; and epitaxially growing a third S/D structure over another recessed portion of the first fin structure, wherein the first word line is between the first S/D structure and the third S/D structure, and the third S/D structure is electrically connected to a deep trench capacitor.

In some embodiments, the method for preparing a semiconductor device structure further comprises: removing a portion of the CESL over the first S/D structure; and forming a bit line contact over the first S/D structure, wherein the first S/D structure is electrically connected to a bit line through the bit line contact.

Embodiments of a semiconductor device structure are provided in accordance with some embodiments of the disclosure. The semiconductor device structure includes a first word line across a first fin structure and a second fin structure, a first S/D structure over the first fin structure, and a second S/D structure over the second fin structure. The first S/D structure and the second S/D structure are formed adjacent to the first word line, and an air gap is formed between the first and second S/D structures. Therefore, the capacitance between adjacent S/D structures (i.e., the first and second S/D structures) may be reduced. As a result, the operation speeds of the semiconductor device structure may be increased, and the overall device performance may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
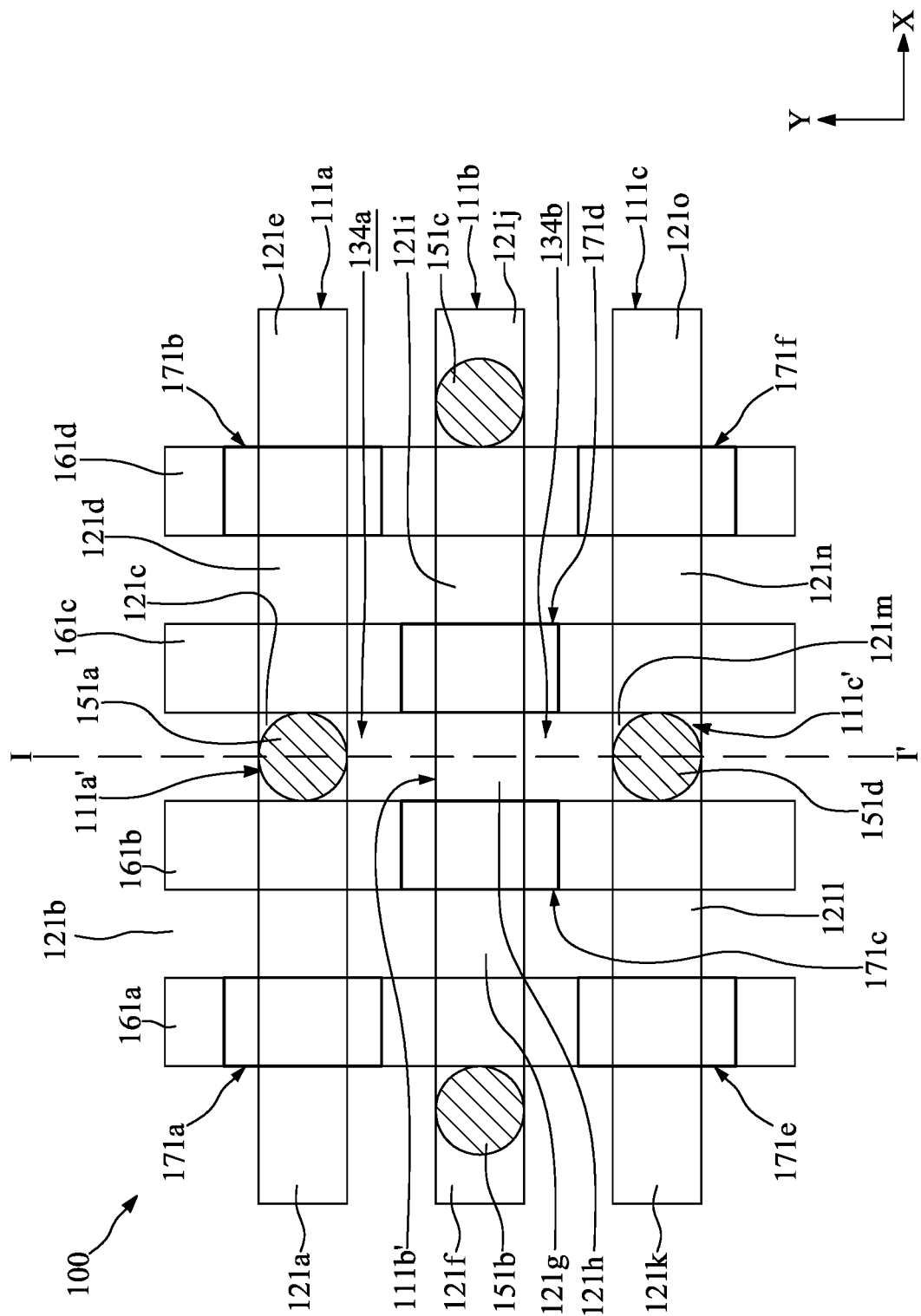
FIG. 1 is a top view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a top view illustrating a semiconductor device structure 100, in accordance with some embodiments. As shown in FIG. 1, the semiconductor device structure 100 includes a plurality of fin structures 111a, 111b and 111c, which are active areas of the semiconductor device structure 100, in accordance with some embodiments. The fin structures 111a, 111b and 111c are parallel to each other and extend along the X direction. It should be noted that, in the present embodiment, the semiconductor device structure 100 is a dynamic random access memory (DRAM).

Moreover, the semiconductor device structure 100 also includes a plurality of word lines 161a, 161b, 161c and 161d, as shown in FIG. 1 in accordance with some embodiments. The word lines 161a to 161d are parallel to each other and extend along the Y direction. In some embodiments, the word lines 161a are gate structures extending across the fin structures 111a to 111c.

In addition, in some embodiments, the fin structures 111a to 111c include recessed portions, which are exposed (i.e., not covered) by the word lines 161a to 161d. As shown in FIG. 1, source/drain (S/D) structures 121a, 121b, 121c, 121d and 121e are disposed over the recessed portions of the fin structure 111a, S/D structures 121f, 121g, 121h, 121i and 121j are disposed over the recessed portions of the fin structure 111b, and S/D structures 121k, 121l, 121m, 121n and 121o are disposed over the recessed portions of the fin structure 111c. It should be noted that only some of the recessed portions of the fin structures 111a, 111b and 111c are shown in FIG. 1 to simplify the diagram. For example, the S/D structure 121c is disposed over the recessed portion 111a' of the fin structure 111a, the S/D structure 121g is disposed over the recessed portion 111b' of the fin structure 111b, and the S/D structure 121m is disposed over the recessed portion 111c' of the fin structure 111c.

The semiconductor device structure 100 further includes bit line contacts 151a, 151b, 151c and 151d disposed over the S/D structures 121c, 121f, 121j and 121m, respectively, and deep trench capacitors 171a, 171b, 171c, 171d, 171e and 171f are covered by the word lines 161a to 161d. More specifically, the bit line contacts 151a to 151d are used to electrically connect the underlying S/D structures 121c, 121f, 121j and 121m to the overlying bit lines, which are not shown in FIG. 1 for the sake of simplicity and clarity.

In some embodiments, the deep trench capacitor 171a is located at the intersection of the word line 161a and the fin structure 111a, the deep trench capacitor 171b is located at the intersection of the word line 161d and the fin structure 111a, the deep trench capacitor 171c is located at the intersection of the word line 161b and the fin structure 111b, the deep trench capacitor 171d is located at the intersection of the word line 161c and the fin structure 111b, the deep trench capacitor 171e is located at the intersection of the word line 161a and the fin structure 111c, and the deep trench capacitor 171f is located at the intersection of the word line 161d and the fin structure 111c. In some embodiments, each of the deep trench capacitors 171a to 171f is embedded in one of the fin structures 111a to 111c. Moreover, the deep trench capacitors 171a to 171f may extend into a semiconductor substrate 101 (shown in FIG. 2) under the fin structures 111a to 111c.

It should be noted that, referring to the S/D structures 121a to 121e over the recessed portions of the fin structure 111a in FIG. 1, the S/D structures 121a and 121e are dummy S/D structures and are not electrically connected to other elements or components, the S/D structure 121b is electrically connected to the deep trench capacitor 171a, the S/D structure 121c is electrically connected to the overlying bit line through the bit line contact 151a, and the S/D structure 121d is electrically connected to the deep trench capacitor 171b, in accordance with some embodiments.

Moreover, referring to the S/D structures 121f to 121j over the recessed portions of the fin structure 111b in FIG. 1, the S/D structure 121f is electrically connected to the overlying bit line through the bit line contact 151b, the S/D structure 121g is electrically connected to the deep trench capacitor 171c, the S/D structure 121h is a dummy S/D structure and is not electrically connected to other elements or components, the S/D structure 121i is electrically connected to the deep trench capacitor 171d, and the S/D structure 121j is electrically connected to the overlying bit line through the bit line contact 151c, in accordance with some embodiments.

Furthermore, the layout of the S/D structures 121k to 121o over the recessed portions of the fin structure 111c is similar to the layout of the S/D structures 121a to 121e. The S/D structures 121k and 121o are dummy S/D structures and are not electrically connected to other elements or components, the S/D structure 121l is electrically connected to the deep trench capacitor 171e, the S/D structure 121m is electrically connected to the overlying bit line through the bit line contact 151d, and the S/D structure 121n is electrically connected to the deep trench capacitor 171f, as shown in FIG. 1 in accordance with some embodiments.

Figure 2:
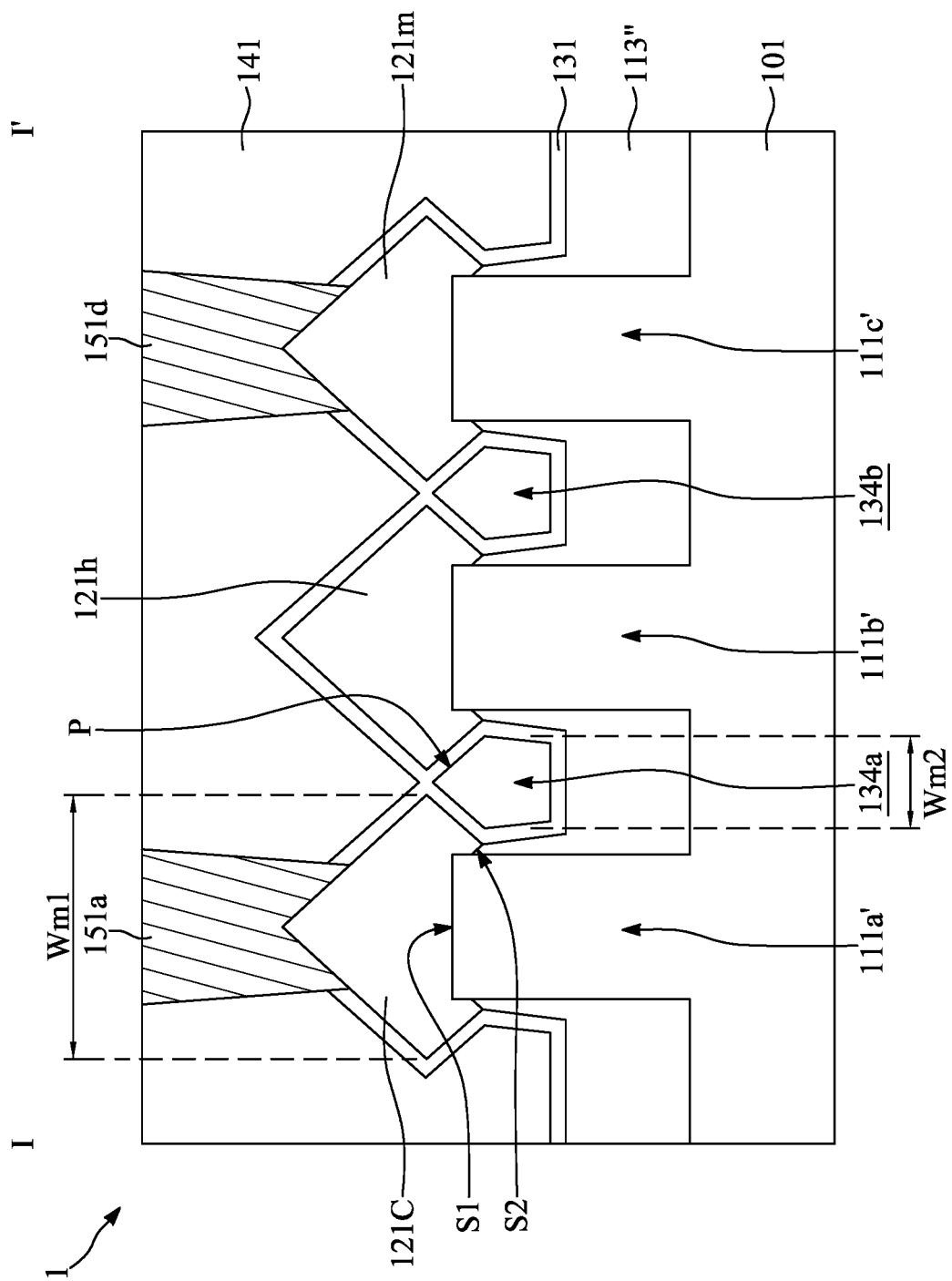
FIG. 2 is a cross-sectional view illustrating the semiconductor device structure along a sectional line I-I' in FIG. 1, in accordance with some embodiments.

FIG. 2 is a cross-sectional view illustrating the semiconductor device structure 100 along the sectional line I-I' in FIG. 1, in accordance with some embodiments. As shown in FIG. 2, an isolation structure 113" is disposed over the semiconductor substrate 101, and the recessed portions 111a', 111b' and 111c' of the fin structures 111a, 111b and 111c protrude from the isolation structure 113", in accordance with some embodiments.

In some embodiments, the S/D structures 121c, 121h and 121m are disposed over the recessed portions 111a', 111b' and 111c', a contact etch stop layer (CESL) 131 is formed covering the S/D structures 121c, 121h, 121m and the isolation structure 113", and a plurality of air gaps are formed between adjacent S/D structures. For example, the air gap 134a is formed between the S/D structures 121c and 121h, and the air gap 134b is formed between the S/D structures 121h and 121m, as shown in FIGS. 1 and 2 in accordance with some embodiments.

Although only three S/D structures 121c, 121h, 121m and three recessed portions 111a', 111b', 111c' of the fin structures 111a, 111b, 111c of the semiconductor device structure 100 are illustrated, it should be noted that, the structures and configurations of the other S/D structures and the other recessed portions of the fin structures may be similar to, or the same as, the S/D structures 121c, 121h, 121m and the recessed portions 111a', 111b', 111c'.

In some embodiments, each of the air gaps 134a and 134b is surrounded by the CESL 131 and is pentagonal in the cross-sectional view of FIG. 2, and the air gaps 134a and 134b are partially covered by the S/D structures 121c, 121h and 121m. More specifically, in some embodiments, the air gap 134a has a topmost point P, and the S/D structure 121c has a maximum width Wm1, wherein the portion of the S/D structure 121c having the maximum width Wm1 is located higher than the topmost point P of the air gap 134a. In some embodiments, the recessed portion 111a' of the fin structure 111a has a top surface S1, which is located higher than a portion of the air gap 134a having a maximum width Wm2, and an interface S2 between the isolation structure 113" and the S/D structure 121c is located higher than the portion of the air gap 134a having the maximum width Wm2. The details of the air gap 134b may be similar to, or the same as, those of the air gap 134a, and are not repeated herein.

In addition, an interlayer dielectric (ILD) structure 141 is disposed over the CESL 131, and the bit line contacts 151a and 151d are formed penetrating through the ILD structure 141 and the CESL 131 to directly contact the S/D structures 121c and 121m, respectively. Although only two air gaps 134a and 134b are shown in FIGS. 1 and 2, the semiconductor device structure 100 may include more than two air gaps. For example, the S/D structures 121b and 121g (see FIG. 1) may have an air gap therebetween. It should be noted that the air gaps may be arranged between adjacent S/D structures along the Y direction, which is parallel to the longitudinal direction of the word lines 161a to 161d.

Figure 3:
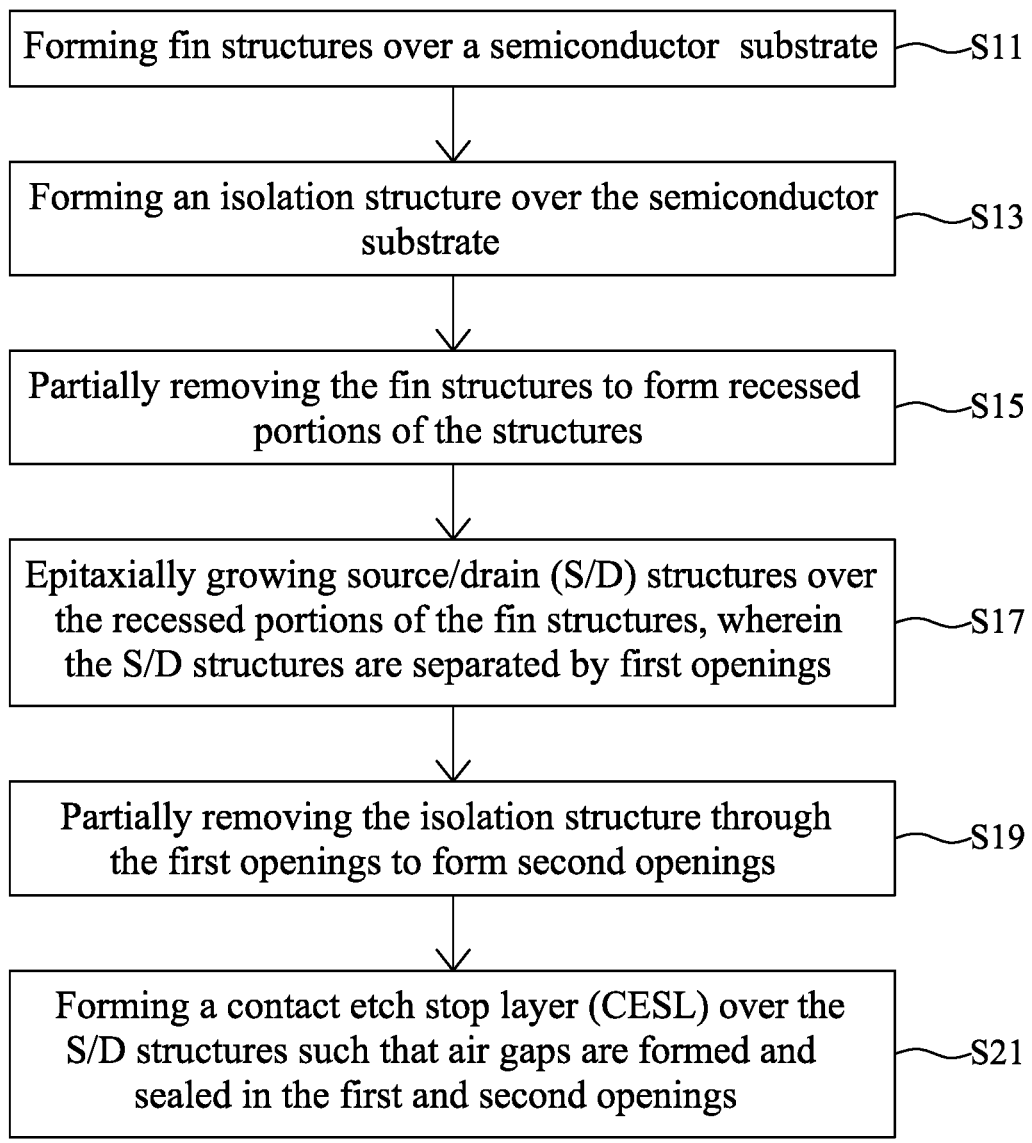
FIG. 3 is a flow diagram illustrating a method of forming the semiconductor device structure, in accordance with some embodiments.

FIG. 3 is a flow diagram illustrating a method 10 of forming the semiconductor device structure 100, and the method 10 includes steps S11, S13, S15, S17, S19 and S21, in accordance with some embodiments. The steps S11 to S21 of FIG. 3 are elaborated in connection with FIGS. 4 to 10.

Figure 4:
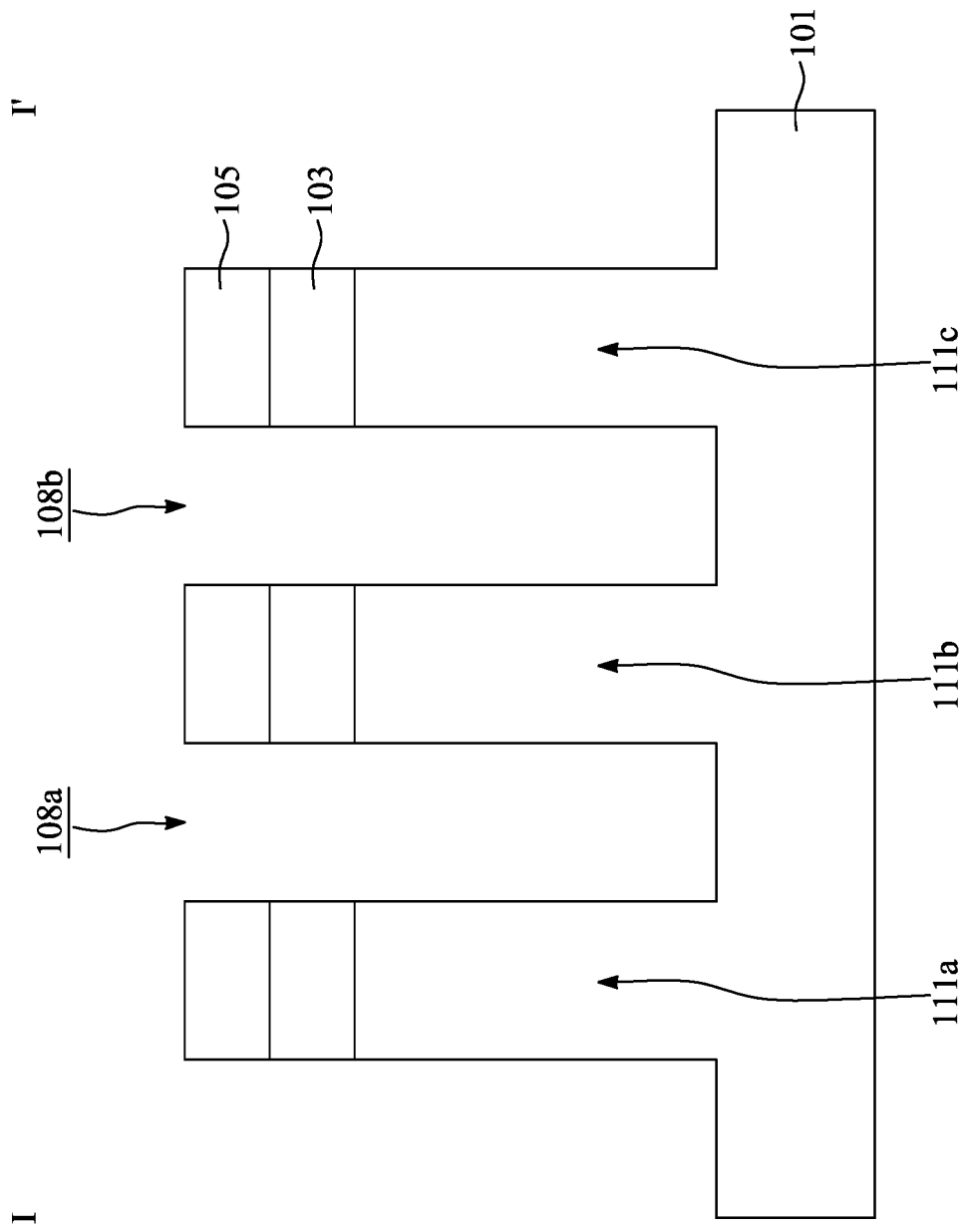
FIG. 4 is a cross-sectional view illustrating an intermediate stage in the formation of the semiconductor device structure along the sectional line I-I' in FIG. 1, in accordance with some embodiments.

FIG. 4 is a cross-sectional view illustrating an intermediate stage in the formation of the semiconductor device structure 100 along the sectional line I-I' in FIG. 1, in accordance with some embodiments.

As shown in FIG. 4, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate, which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In some embodiments, a dielectric layer (not shown) is disposed over the semiconductor substrate 101, a mask layer (not shown) is disposed over the dielectric layer, and a patterned photoresist layer (not shown) is disposed over the mask layer. The patterned photoresist layer may be formed by a deposition process and a patterning process.

The deposition process for forming the patterned photoresist layer may include a chemical vapor deposition (CVD) process, a high-density plasma chemical vapor deposition (HDPCVD) process, a spin-coating process, a sputtering process, or another applicable process. The patterning process for forming the patterned photoresist layer may include a photolithography process and an etching process. The photolithography process may include photoresist coating (e.g., spin coating), soft baking, mask aligning, exposure, post-exposure baking, developing the photoresist, rinsing and drying (e.g., hard baking). The etching process may include a dry etching process or a wet etching process.

Moreover, the dielectric layer may be a buffer layer between the semiconductor substrate 101 and the mask layer. In some embodiments, the dielectric layer is used as a stop layer when the mask layer is removed. The dielectric layer may be made of silicon oxide. The mask layer may be made of silicon oxide, silicon nitride, silicon oxynitride, or another applicable material. The dielectric layer and the mask layer may be formed by deposition processes, which may include a CVD process, an HDPCVD process, a spin-coating process, a sputtering process, or another applicable process.

After the patterned photoresist layer is formed, the dielectric layer and the mask layer are patterned using the patterned photoresist layer as a mask, as shown in FIG. 4 in accordance with some embodiments. As a result, a patterned dielectric layer 103 and a patterned mask layer 105 are obtained. Next, the patterned photoresist layer is removed.

Next, an etching process is performed on the semiconductor substrate 101 to form the fin structures 111a, 111b and 111c using the patterned dielectric layer 103 and the patterned mask layer 105 as a mask. The respective step is illustrated as the step S11 in the method 10 shown in FIG. 3. The etching process may be a dry etching process or a wet etching process. After the etching process for forming the fin structures 111a to 111c, the fin structures 111a to 111c are separated by openings 108a and 108b.

In some embodiments, the semiconductor substrate 101 is etched by a dry etching process. The dry etching process includes using a fluorine-based etchant gas, such as $SF_6$, $C_xF_y$, $NF_3$ or a combination thereof. The etching process may be a time-controlled process, and may continue until the fin structures 111a to 111c reach a predetermined height. In some embodiments, each of the fin structures 111a to 111c has a width that gradually increases from the top portion to the bottom portion.

Figure 5:
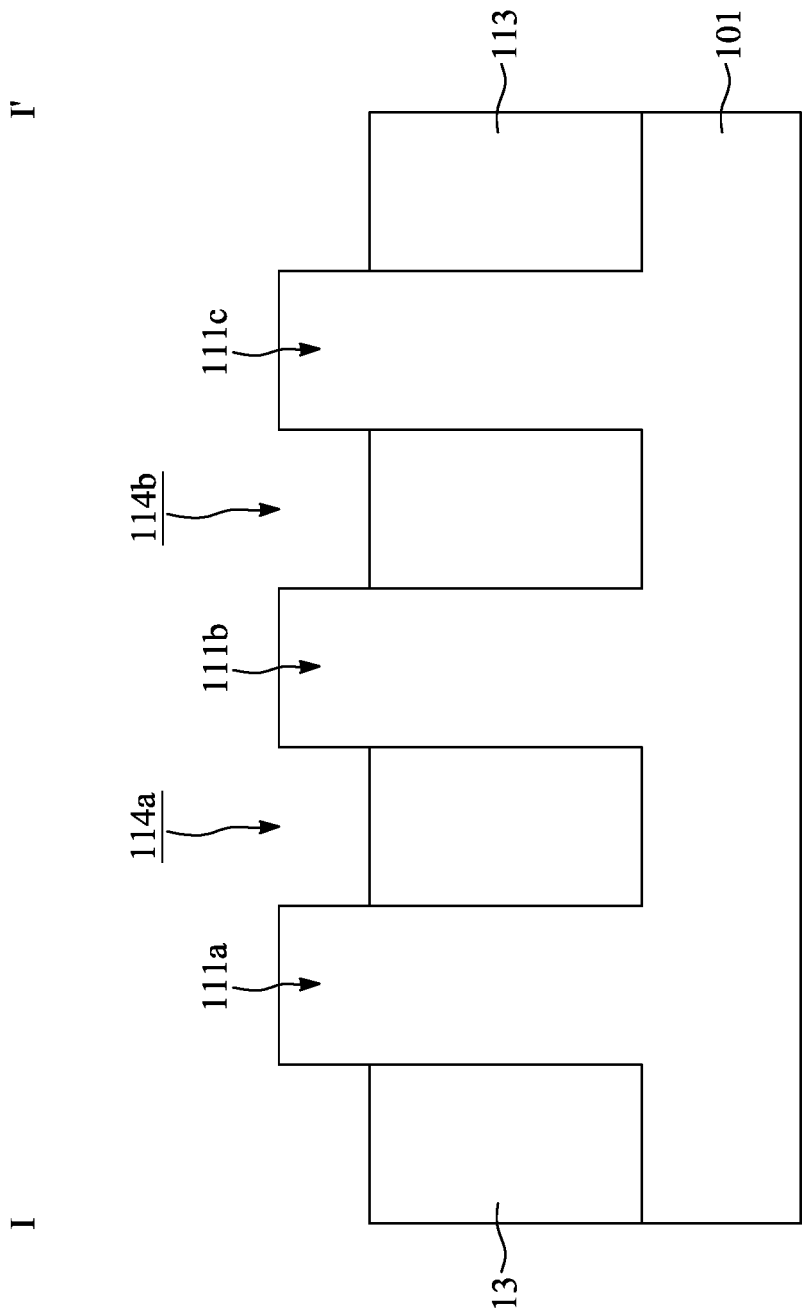
FIG. 5 is a cross-sectional view illustrating an intermediate stage in the formation of the semiconductor device structure along the sectional line I-I' in FIG. 1, in accordance with some embodiments.

FIG. 5 is a cross-sectional view illustrating an intermediate stage in the formation of the semiconductor device structure along the sectional line I-I' in FIG. 1, in accordance with some embodiments.

After the fin structures 111a to 111c are formed, an insulating material (not shown) is formed to cover the fin structures 111a to 111c, the patterned dielectric layer 103, and the patterned mask layer 105 over the semiconductor substrate 101, in accordance with some embodiments. In other words, the openings 108a and 108b are filled by the insulating material, in accordance with some embodiments. In some embodiments, the insulating material is made of silicon oxide, silicon nitride, silicon oxynitride, fluoride-doped silicate glass (FSG), or another low-k dielectric material. The insulating material may be deposited by a CVD process, a spin-on-glass process, or another applicable process.

Next, the insulating material is thinned or planarized to expose the top surface of the patterned mask layer 105. In some embodiments, the insulating material is thinned by a chemical mechanical polishing (CMP) process. Next, the patterned dielectric layer 103 and the patterned mask layer 105 are removed.

After the patterned dielectric layer 103 and the patterned mask layer 105 are removed, an upper portion of the insulating material is removed to form an isolation structure 113, as shown in FIG. 5 in accordance with some embodiments. The respective step is illustrated as the step S13 in the method 10 shown in FIG. 3. The isolation structure 113 may be a shallow trench isolation (STI) structure surrounding the fin structures 111a to 111c. In some embodiments, lower portions of the openings 108a and 108b are filled by the isolation structure 113, and openings 114a and 114b are disposed over the isolation structure 113 and between adjacent fin structures 111a, 111b and 111c.

In some embodiments, portions of the fin structures 111a to 111c are embedded in the isolation structure 113. More specifically, the lower portions of the fin structures 111a to 111c are surrounded by the isolation structure 113 while the upper portions of the fin structures 111a to 111c protrude from the isolation structure 113. The isolation structure 113 is configured to prevent electrical interference or crosstalk.

Figure 6:
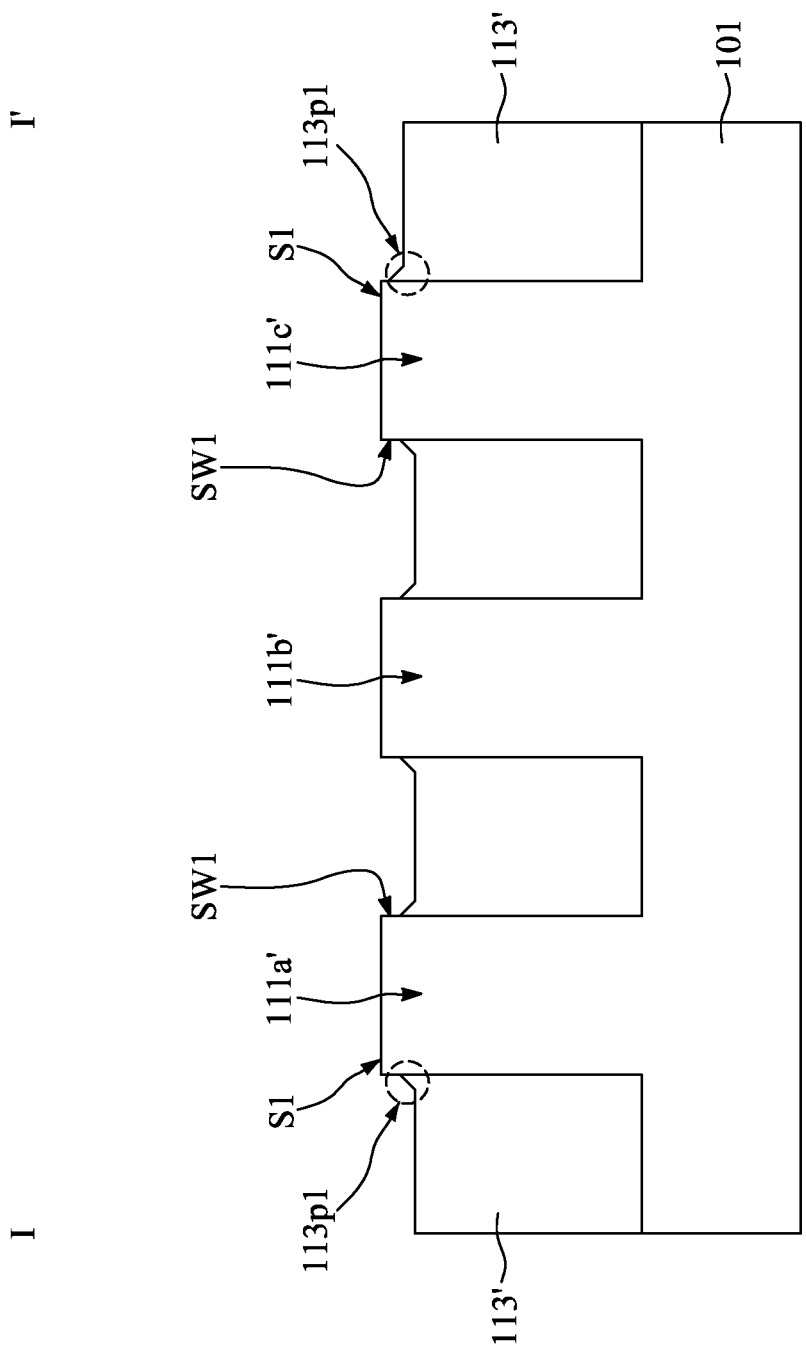
FIG. 6 is a cross-sectional view illustrating an intermediate stage in the formation of the semiconductor device structure along the sectional line I-I' in FIG. 1, in accordance with some embodiments.

FIG. 6 is a cross-sectional view illustrating an intermediate stage in the formation of the semiconductor device structure 100 along the sectional line I-I' in FIG. 1, in accordance with some embodiments.

After the isolation structure 113 is formed, the word lines 161a to 161d (see FIG. 1) are disposed across the fin structures 111a to 111c and extend over the isolation structure 113, and portions of the fin structures 111a to 111c exposed (i.e., not covered) by the word lines 161a to 161d are partially removed to form recessed portions of the fin structures, such as the recessed portion 111a' of the fin structure 111a, the recessed portion 111b' of the fin structure 111b and the recessed portion 111c' of the fin structure 111c as shown in FIG. 6 in accordance with some embodiments. The respective step is illustrated as the step S15 in the method 10 shown in FIG. 3.

In some embodiments, the word lines 161a to 161d are gate structures disposed across the fin structures 111a to 111c, and the word lines 161a to 161d are formed as dummy gate structures during this step, which will be replaced with gate structures (i.e., metal gate structures) after the CESL 131 and the ILD structure 141 are formed in subsequent processes.

More specifically, portions of the fin structures 111a, 111b and 111c adjacent to the word lines 161a to 161d are recessed to form recessed portions (e.g., the recessed portions 111a', 111b' and 111c') at two sides of the fin structures 111a, 111b and 111c. In some embodiments, the upper portions of the isolation structure 113 are removed during the recessing of the fin structures 111a, 111b and 111c, such that the recessed portions 111a', 111b' and 111c' protrude from a recessed isolation structure 113'.

In some embodiments, the recessed isolation structures 113' have protruding portions 113p1 adjacent to the recessed portions 111a', 111b' and 111c' of the fin structures 111a, 111b and 111c, and the protruding portions 113p1 have concave surfaces. In some embodiments, the recessed portions 111a', 111b' and 111c' have top surfaces S1 and sidewalls SW1 exposed (i.e., not covered) by the recessed isolation structure 113'.

Figure 7:
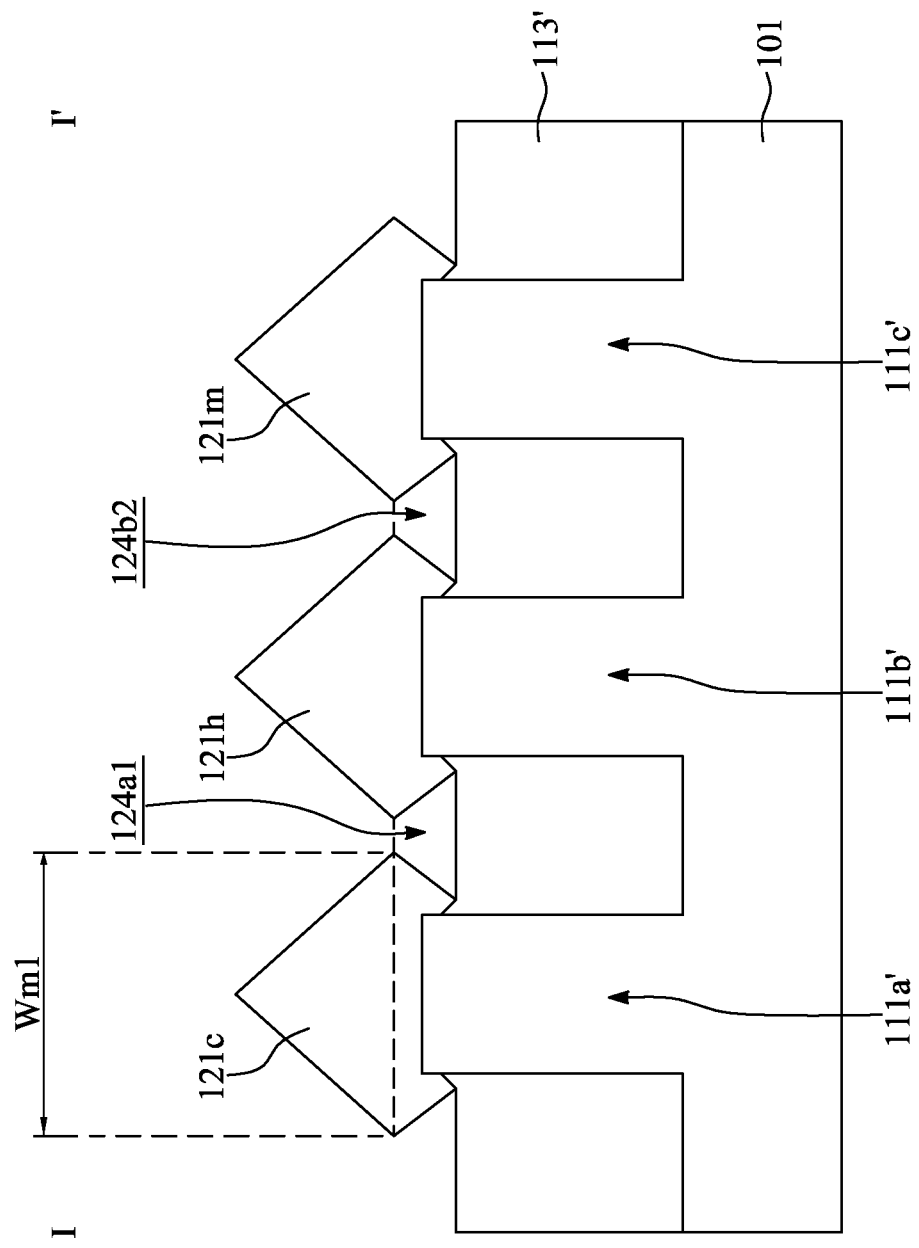
FIG. 7 is a cross-sectional view illustrating an intermediate stage in the formation of the semiconductor device structure along the sectional line I-I' in FIG. 1, in accordance with some embodiments.

FIG. 7 is a cross-sectional view illustrating an intermediate stage in the formation of the semiconductor device structure 100 along the sectional line I-I' in FIG. 1, in accordance with some embodiments.

Next, the S/D structures 121a to 121o are epitaxially grown over the recessed portions of the fin structures 111a, 111b and 111c. For example, the S/D structures 121c, 121h and 121m are disposed over the recessed portions 111a', 111b' and 111c' of the fin structures 111a to 111c, as shown in FIG. 7 in accordance with some embodiments. The respective step is illustrated as the step S17 in the method 10 shown in FIG. 3. It should be noted that, in some embodiments, the S/D structures 121a to 121o are separated from each other. That is, the S/D structures 121a to 121o are not connected to each other, or not merged together.

More specifically, the S/D structure 121c is separated from the S/D structure 121h by a first opening 124a1, and the S/D structure 121h is separated from the S/D structure 121m by another first opening 124b1, as shown in FIG. 7 in accordance with some embodiments. In some embodiments, the top boundaries of the first openings 124a1 and 124b1 are defined as aligned with the locations of the maximum width of the adjacent S/D structures, such as the maximum with Wm1 of the S/D structures 121c, and a width of each of the first openings 124a1 and 124b1 increases from the top portions to the bottom portions.

In some embodiments, a strained material is grown over the recessed portions of the fin structures 111a, 111b and 111c by an epitaxial (epi) process to form the S/D structures 121a to 121o. In addition, the lattice constant of the strained material may be different from the lattice constant of the semiconductor substrate 101. In some embodiments, the materials of the S/D structures 121a to 121o include Ge, SiGe, InAs, InGaAs, InSb, GaAs, GaSb, InAlP, InP, or the like.

Figure 8:
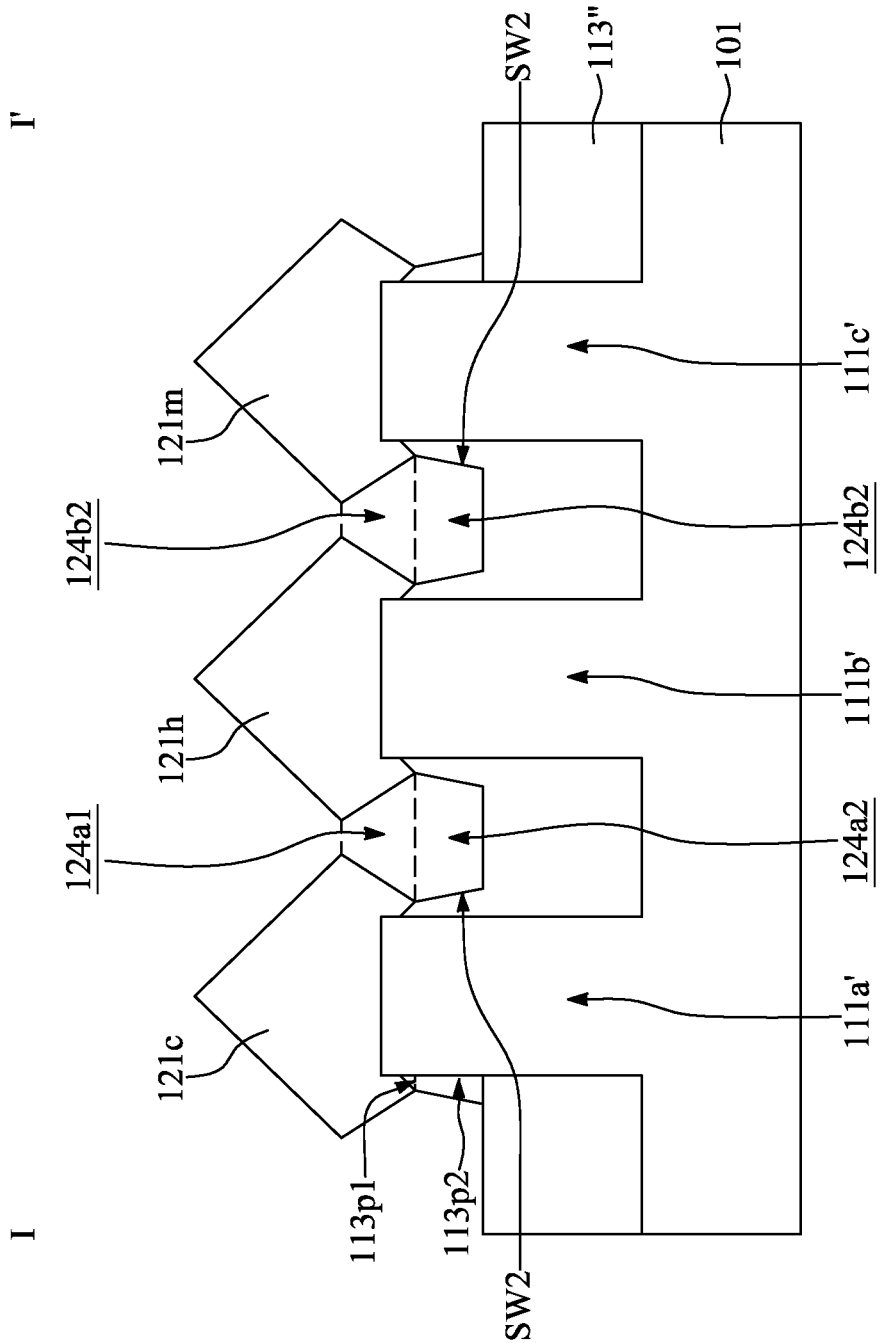
FIG. 8 is a cross-sectional view illustrating an intermediate stage in the formation of the semiconductor device structure along the sectional line I-I' in FIG. 1, in accordance with some embodiments.

FIG. 8 is a cross-sectional view illustrating an intermediate stage in the formation of the semiconductor device structure 100 along the sectional line I-I' in FIG. 1, in accordance with some embodiments.

After the S/D structures 121a to 121o are epitaxially grown, the upper portions of the recessed isolation structure 113' are removed to form an isolation structure 113", which is a remaining portion of the recessed isolation structure 113', as shown in FIG. 8 in accordance with some embodiments. More specifically, the recessed isolation structure 113' is partially removed through the first openings 124a1 and 124b1 to form second openings 124a2 and 124b2 in the isolation structure 113". The respective step is illustrated as the step S19 in the method 10 shown in FIG. 3.

In some embodiments, the partial removal of the recessed isolation structure 113' includes a wet etching process, a dry etching process, or a combination thereof. After the etching process, the second openings 124a2 and 124b2 are formed under the first openings 124a1 and 124b1, and between protruding portions 113p2 of the isolation structure 113", wherein the protruding portions 113p2 are located under the protruding portions 113p1. In some embodiments, a width of each of the second openings 124a2 and 124b2 decreases from the top portions to the bottom portions. Moreover, the protruding portions 113p2 of the isolation structure 113" have sidewalls SW2 exposed by the second openings 124a2 and 124b2.

Figure 9:
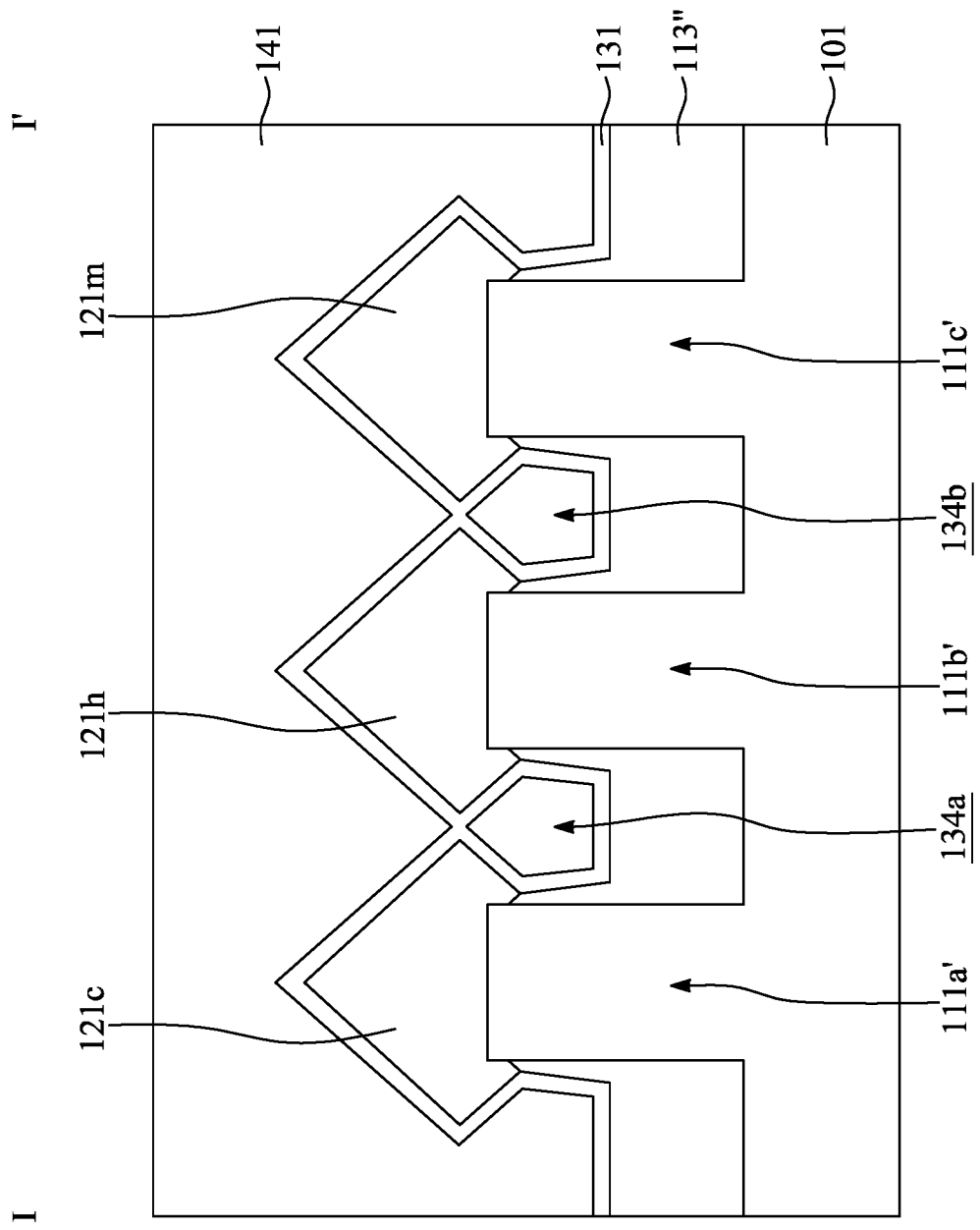
FIG. 9 is a cross-sectional view illustrating an intermediate stage in the formation of the semiconductor device structure along the sectional line I-I' in FIG. 1, in accordance with some embodiments.

FIG. 9 is a cross-sectional view illustrating an intermediate stage in the formation of the semiconductor device structure 100 along the sectional line I-I' in FIG. 1, in accordance with some embodiments.

Next, the CESL 131 is disposed over the S/D structures 121a to 121o such that air gaps are formed and sealed in the first and second openings. For example, the air gaps 134a and 134b are formed as shown in FIG. 9 in accordance with some embodiments. The respective step is illustrated as the step S21 in the method 10 shown in FIG. 3.

In some embodiments, the CESL 131 is formed covering the sidewalls SW2 of the isolation structure 113", wherein the sidewalls SW2 are exposed by the second openings 124a2 and 124b2, and the CESL 131 also covers the sidewalls of the S/D structures 121a to 121o. As a result, the air gaps 134a and 134b are surrounded by the CESL 131 in the cross-sectional view of FIG. 9. In some embodiments, the CESL 131 is made of silicon nitride, silicon oxynitride, and/or other applicable materials. Moreover, the CESL 131 is formed by plasma-enhanced CVD, low-pressure CVD, atomic layer deposition (ALD), or other applicable processes, in accordance with some embodiments.

After the CESL 131 is formed, the ILD structure 141 is disposed over the CESL 131. It should be noted that, in the present embodiments, since the air gaps 134a and 134b are sealed by the CESL 131, the ILD structure 141 is not deposited into the air gaps 134a and 134b. In some embodiments, the ILD structure 141 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of the low-k dielectric materials include, but are not limited to, fluorinated silica glass (FSG), carbon doped silicon oxide, amorphous fluorinated carbon, parylene, bis-benzocyclobutenes (BCB) and polyimide. In addition, the ILD structure 141 may be formed by CVD, physical vapor deposition, (PVD), atomic layer deposition (ALD), spin coating, or another applicable process.

Figure 10:
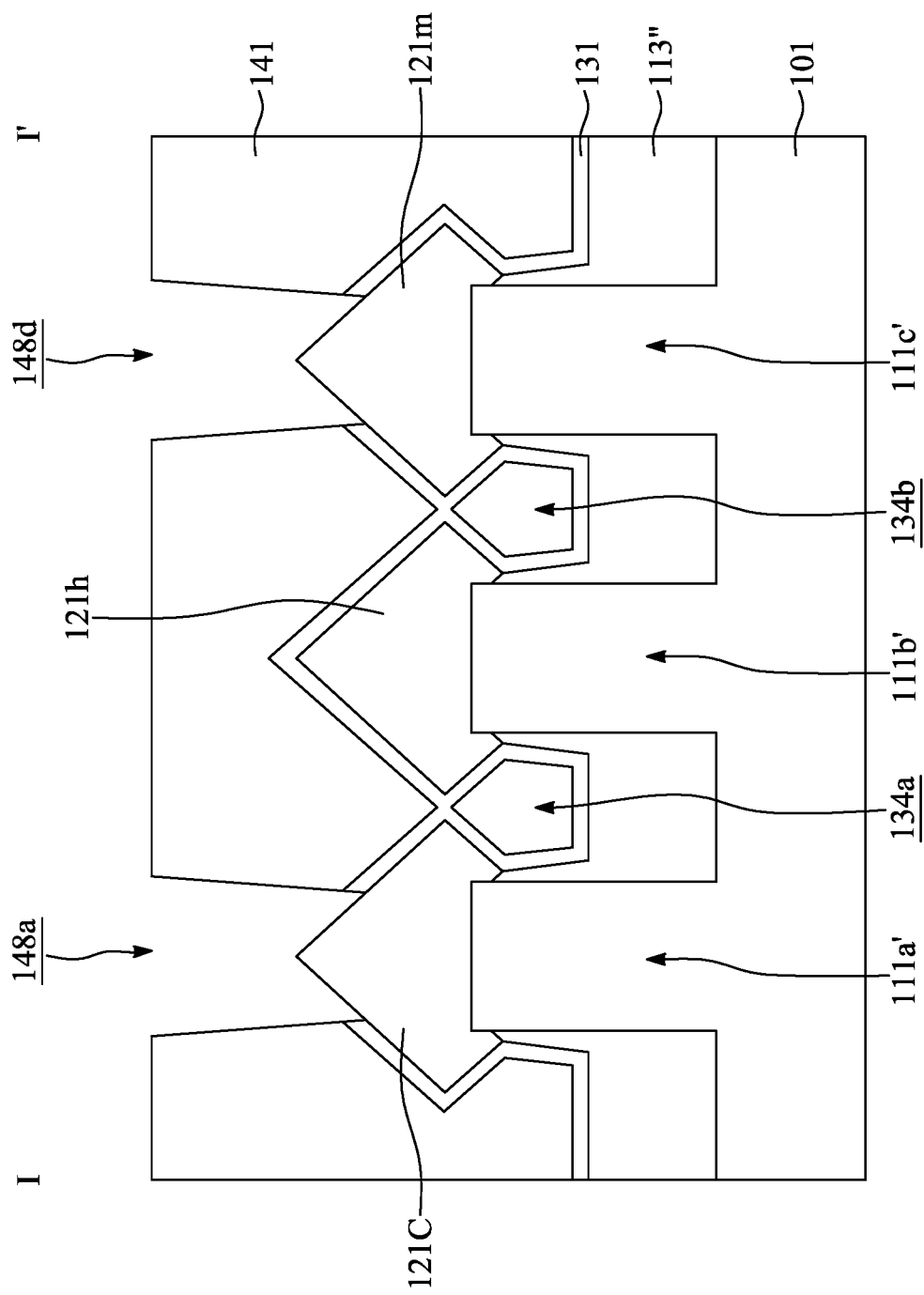
FIG. 10 is a cross-sectional view illustrating an intermediate stage in the formation of the semiconductor device structure along the sectional line I-I' in FIG. 1, in accordance with some embodiments.

FIG. 10 is a cross-sectional view illustrating an intermediate stage in the formation of the semiconductor device structure 100 along the sectional line I-I' in FIG. 1, in accordance with some embodiments.

After the ILD structure 141 is formed, the ILD structure 141 and the CESL 131 are partially removed to form a plurality of contact openings exposing the underlying S/D structures, which are designed to be electrically connected to the subsequently-formed bit lines. For example, the contact openings 148a and 148d are formed to expose the S/D structures 121c and 121m, respectively, as shown in FIG. 10 in accordance with some embodiments. Specifically, the ILD structure 141 and the CESL 131 are partially removed by an etching process, such as a dry etching process.

Next, the bit line contacts 151a to 151d are formed in the contact openings surrounded by the CESL 131 and the ILD structure 141, such as the bit line contacts 151a and 151d as shown in the cross-sectional view of FIG. 2 in accordance with some embodiments.

In some embodiments, each of the bit line contacts 151a to 151d includes multiple layers. In some embodiments, the materials of the bit line contacts 151a to 151d include poly-crystalline silicon, tungsten (W), aluminum (Al), copper (Cu), nickel (Ni), cobalt (Co), cobalt silicide, titanium silicide, tantalum silicide, nickel silicide, copper silicide, tungsten silicide, molybdenum silicide, another applicable conductive material or a combination thereof.

In addition, in some embodiments, the deep trench capacitors 171a to 171f are formed after the fin structures 111a to 111c are formed. In some embodiments, the deep trench capacitors 171a to 171f are formed before the formation of the dummy gate structures, which are used to form the word lines 161a to 161d. In some embodiments, the semiconductor device structure 100 is a DRAM, and the bit line contacts 151a to 151d are used to form vertical electrical connections between the underlying S/D structures and the overlying bit lines.

Embodiments of semiconductor device structures and method for preparing the same are provided. The semiconductor device structure 100 includes the word lines 161a to 161d disposed across the fin structures 111a to 111c, the S/D structures 121a to 121o disposed over the recessed portions (e.g., the recessed portions 111a', 111b' and 111c') of the fin structures 111a to 111c and adjacent to the word lines 161a to 161d, and the air gaps (e.g., air gaps 134a and 134b) formed between the adjacent S/D structures (e.g., S/D structures 121c, 121h and 121m) along the direction parallel to the longitudinal direction of the word lines 161a to 161d. Since the air gaps are formed between the adjacent S/D structures and the air gaps extend into adjacent recessed portions of the fin structures 111a to 111c, the capacitance between the adjacent S/D structures may be reduced. As a result, the operation speeds of the semiconductor device structure 100 may be increased, and the overall device performance may be improved.

In one embodiment of the present disclosure, a semiconductor device structure is provided. The semiconductor device structure includes a first fin structure and a second fin structure disposed over a semiconductor substrate, and a first word line disposed across the first fin structure and the second fin structure. The semiconductor device structure also includes a first source/drain (S/D) structure disposed over the first fin structure and adjacent to the first word line, and a second S/D structure disposed over the second fin structure and adjacent to the first word line. The first S/D structure and the second S/D structure have an air gap therebetween.

In another embodiment of the present disclosure, a semiconductor device structure is provided. The semiconductor device structure includes a first fin structure and a second fin structure disposed over a semiconductor substrate, and a first word line and a second word line disposed across the first fin structure and the second fin structure. The semiconductor device structure also includes a first source/drain (S/D) structure disposed over a recessed portion of the first fin structure and between the first word line and the second word line, and a second S/D structure disposed over a recessed portion of the second fin structure and between the first word line and the second word line. The recessed portion of the first fin structure and the recessed portion of the second fin structure have a first air gap therebetween.

In one embodiment of the present disclosure, a method for preparing a semiconductor device structure is provided. The method includes forming a first fin structure and a second fin structure over a semiconductor substrate, and forming an isolation structure over the semiconductor substrate. The first fin structure and the second fin structure protrude from the isolation structure. The method also includes partially removing the first fin structure and the second fin structure to form a recessed portion of the first fin structure and a recessed portion of the second fin structure, and epitaxially growing a first source/drain (S/D) structure over the recessed portion of the first fin structure and a second S/D structure over the recessed portion of the second fin structure. The first S/D structure is separated from the second S/D structure by a first opening. The method further includes partially removing the isolation structure through the first opening to form a second opening, and forming a contact etch stop layer (CESL) over the first S/D structure and the second S/D structure such that an air gap is formed and sealed in the first opening and the second opening.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device structure, comprising:
    forming a first fin structure and a second fin structure over a semiconductor substrate;
    forming an isolation structure over the semiconductor substrate, wherein the first fin structure and the second fin structure protrude from the isolation structure;
    partially removing the first fin structure and the second fin structure to form a recessed portion of the first fin structure and a recessed portion of the second fin structure;
    epitaxially growing a first source/drain (S/D) structure over the recessed portion of the first fin structure and a second S/D structure over the recessed portion of the second fin structure, wherein the first S/D structure is separated from the second S/D structure by a first opening;
    partially removing the isolation structure through the first opening to form a second opening; and
    forming a contact etch stop layer (CESL) over the first S/D structure and the second S/D structure such that an air gap is formed and sealed in the first opening and the second opening.

2. The method for preparing a semiconductor device structure of claim 1, wherein a top surface and a sidewall of the recessed portion of the first fin structure protrude from the isolation structure before the first S/D structure is epitaxially grown.

3. The method for preparing a semiconductor device structure of claim 1, wherein a width of the first opening increases from a top portion of the first opening to a bottom portion of the first opening, and a width of the second opening decreases from a top portion of the second opening to a bottom portion of the second opening.

4. The method for preparing a semiconductor device structure of claim 1, wherein a sidewall of the isolation structure is exposed in the second opening.

5. The method for preparing a semiconductor device structure of claim 4, wherein the CESL extends into the first opening and the second opening, and the sidewall of the isolation structure is covered by the CESL.

6. The method for preparing a semiconductor device structure of claim 1, further comprising:
    forming a first word line and a second word line across the first fin structure and the second fin structure, wherein the first S/D structure, the second S/D structure, and the air gap are between the first word line and the second word line; and
    epitaxially growing a third S/D structure over another recessed portion of the first fin structure, wherein the first word line is between the first S/D structure and the third S/D structure, and the third S/D structure is electrically connected to a deep trench capacitor.

7. The method for preparing a semiconductor device structure of claim 1, further comprising:
    removing a portion of the CESL over the first S/D structure; and
    forming a bit line contact over the first S/D structure, wherein the first S/D structure is electrically connected to a bit line through the bit line contact.

* * * * *